Figure 1A:
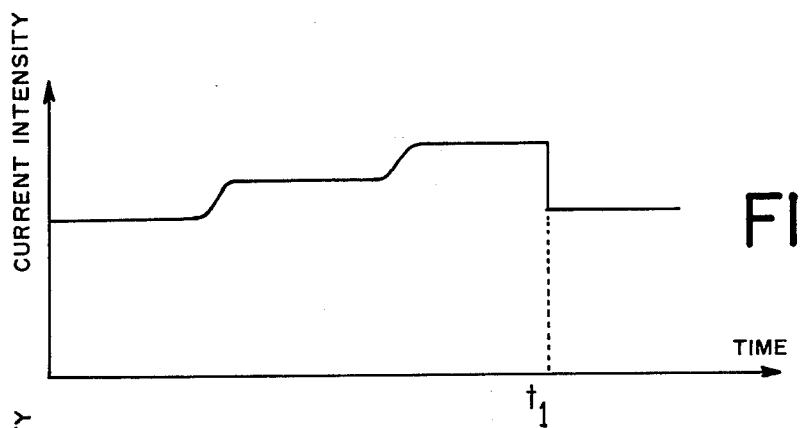

United States Patent
Someya et al.

[11] 3,936,756
[45] Feb. 3, 1976

[54] FIELD EMISSION ELECTRON GUN HAVING AUTOMATIC CURRENT CONTROL

[75] Inventors: Teruo Someya, Akishima; Nobuyuki Kobayashi, Kodaira; Toshinori Goto, Fussa, all of Japan

[73] Assignee: Nihon Denshi Kabushiki Kaisha, Tokyo, Japan

[22] Filed: Jan. 31, 1974

[21] Appl. No.: 438,384

Related U.S. Application Data

[63] Continuation-in-part of Ser. No. 245,328, April 19, 1972, Pat. No. 3,825,839.

[30] Foreign Application Priority Data
Apr. 30, 1971 Japan.............................. 46-28753
July 12, 1971 Japan.............................. 46-51610

[52] U.S. Cl. ..................... 328/9; 250/311; 315/106; 315/107; 315/307; 315/311; 328/10
[51] Int. Cl.² ......................................... H02H 7/20
[58] Field of Search ........... 315/106, 107, 307, 311; 328/8–10; 178/DIG. 29; 250/311

[56] References Cited
UNITED STATES PATENTS
3,377,506  4/1968  Banas et al. ..................... 315/106 X
3,619,717  11/1971  Lee...................................... 315/307
3,691,377  9/1972  Matsui et al. ....................... 315/307

OTHER PUBLICATIONS
Crewe, "High Resolution S.E.M.", Scientific American, April, 1971, pp. 26–35.

Primary Examiner—Maynard R. Wilbur
Assistant Examiner—Richard E. Berger
Attorney, Agent, or Firm—Webb, Burden, Robinson & Webb

[57] ABSTRACT

An improved field emission type electron gun is automatically controlled so as to generate a stable emission current. The preferred embodiment employs a detecting means for detecting the emission current fluctuation and a control means for controlling the electric field for field emission according to the output signal of said detecting means.

4 Claims, 9 Drawing Figures

FIELD EMISSION ELECTRON GUN HAVING AUTOMATIC CURRENT CONTROL

RELATED APPLICATION

This application is a continuation-in-part of application Ser. No. 245,328, filed Apr. 19, 1972, now U.S. Pat. No. 3,825,839, entitled "CONSTANT CURRENT FIELD EMISSION ELECTRON GUN" claiming priority under 35 U.S.C. 119 to Japanese Application No. 46-28753 and No. 46-51610 filed Apr. 30, and July 12, 1971, respectively.

This invention relates to a field emission type electron gun for use in scanning and transmission type electron microscopes.

The advantage of the field emission type electron gun, when compared with the ordinary thermionic emission type electron gun, when used in electron microscopes, lies in the fact that the current density of the electron beam is very high and the electron source is very small. Such being the case, the field emission type electron gun, when used in a scanning type electron microscope, provides better image resolution than would be possible with the thermionic emission type electron gun. Also, when used in a transmission type electron microscope, this type of gun ensures better image contrast than in the case of the thermionic emission type electron gun, as a result of improved coherency of electron beams.

However, in spite of the aforementioned advantages, the field emission type electron gun possesses certain defects foremost of which is the fact that the current density of the electron beam gradually becomes unstable as a result of contamination on the emitter surface and also deformation of the emitter tip. Various ways have been devised to counteract this instability. A popular method, although somewhat impractical due to high manufacturing costs and maintenance, is to maintain the gun chamber at a super-high vacuum, for example, on the order of $10^{-9}$ to $10^{-10}$ Torr. By so doing, the local work functions of the emitter remains stable since the emitter surface contamination is prevented.

Another method is to maintain the emitter at a high temperature during field emission. By so doing, contamination is prevented and the electron beam current remains stable in spite of the comparatively low degree of vacuum. Heating the emitter, however, as described above, causes the emitter tip to become soft which results in a gradual buildup of crystal planes on the surface of the emitter. This crystalline formation or buildup, if allowed to progress, would cause the electric field intensity at the emitter tip to increase locally and irregularly resulting in excess emission and eventual damage to the emitter tip.

The field emission gun according to this invention is characterized by the provision of a device or circuit for detecting the electron beam current fluctuation and a device or circuit for controlling the electric field in accordance with the output (feedback) signal for the detecting circuit.

Figure 1B:
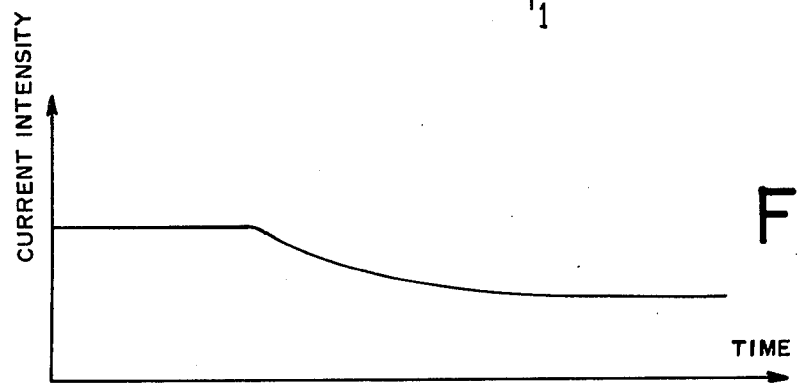

Further features and other objects and advantages will become clear from a reading of the following detailed description made with reference to the drawings in which:

FIGS. 1(a) and 1(b) are graphs showing the relationship between the emission current and elapsed time in a field emission type electron gun;

FIGS. 2 to 8 are block diagrams of the field emission type electron guns according to this invention.

FIGS. 1(a) and 1(b) are graphs showing the relationship between the electron beam current and elapsed time in a conventional field emission type gun. The graded increase of the electron beam current shown in FIG. 1(a) is due to crystal buildup but by weakening the electric field at the emitter tip at $t_1$, the current intensity may be reduced to its initial value. After remaining at this value for some time, the current intensity gradually decreases as shown in FIG. 1(b) and may be restored once more to its original value by intensifying the electric field. Thus, by controlling the electric field, the current intensity of the electron beam can be kept stable.

Figure 2:
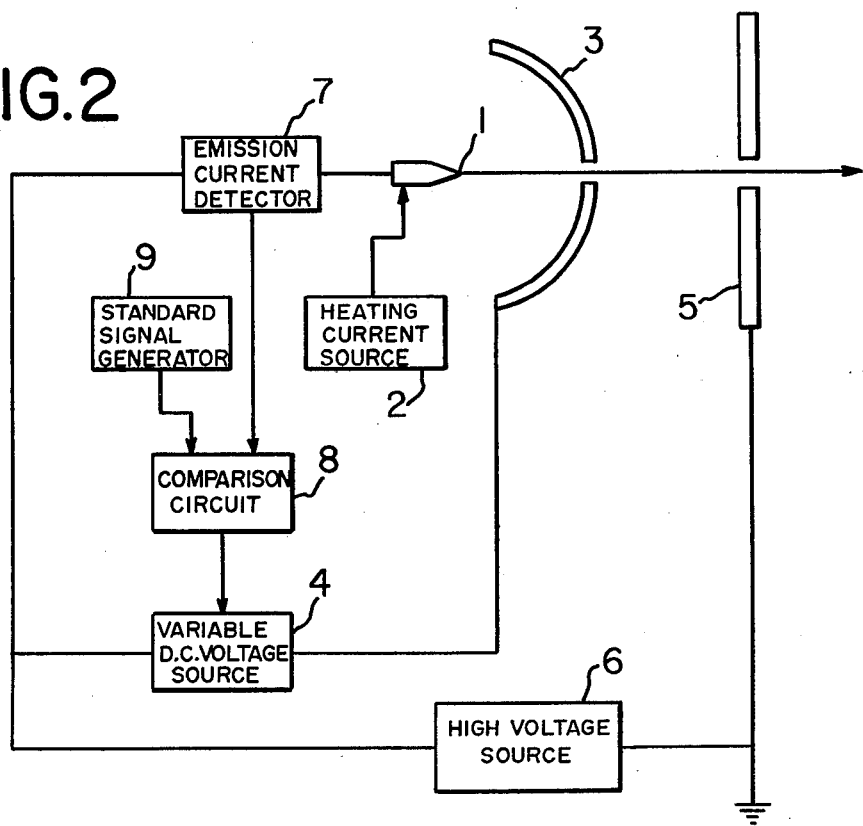

FIG. 2 shows one embodiment of this invention. Emitter 1 made of tungsten or the like, is heated to a suitable temperature, for example 1600°C, by applying current from a heating current source 2. The first anode 3 is maintained at a potential positive to that of the emitter by means of a variable D.C. voltage source 4. A second anode 5 is connected to the positive output terminal of a high voltage accelerating source 6, said terminal being maintained at ground potential. The negative output terminal of the source 6 is connected to the emitter 1 via an emission current detector 7 which detects all the electrons emitted from said emitter and converts them into an electrical signal. The output signal from the emission current detector 7 is then applied to a comparison circuit 8 where it is compared with a reference signal from a standard signal generator 9. The compared signal is applied to the variable D.C. voltage source 4, thereby controlling the potential of the first electrode 3 so as to keep the electron current constant.

By so doing, even if the emitter tip is slightly deformed by a strong electric field, the emitter can be used over a long period of time, because the potential of the first electrode 3 decreases so as to prevent an increase of emission current. Again, since the emitter tips do not necessarily have to be exactly identical, in view of the fact that the constant electron beam current is obtained at all times, emitter exchange presents no problems.

Figure 3:
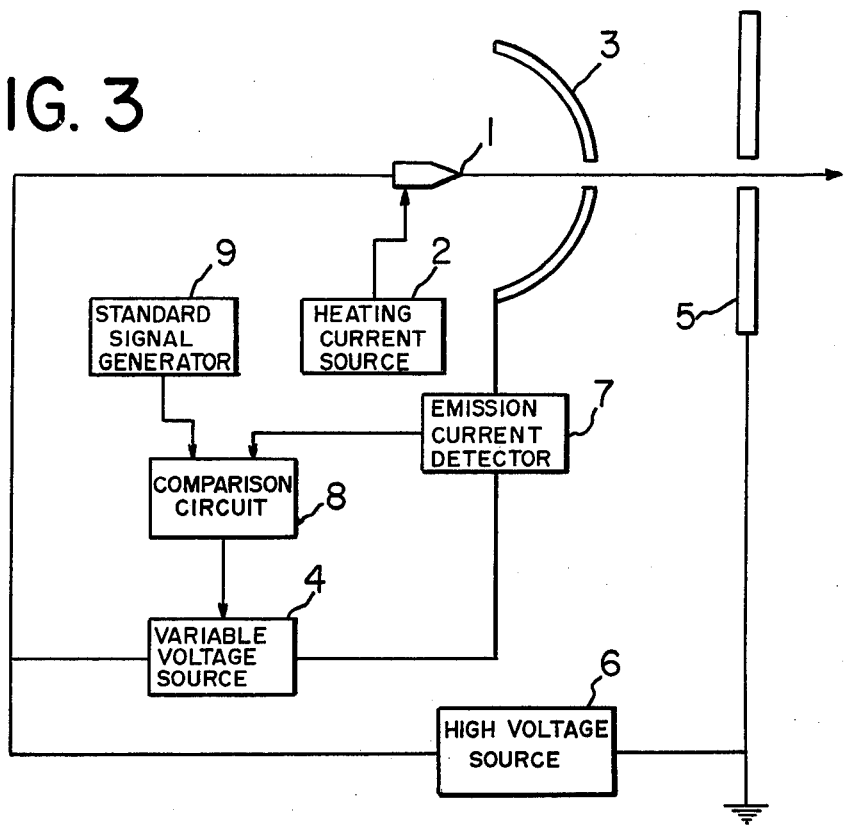

FIG. 3 shows another embodiment of this invention in which the emission current detector 7 is arranged between the variable D.C. voltage source 4 and the first electrode 3. In this arrangement, the inflow of electrons to the first anode 3 is detected and since this inflow is proportional to the outflow of electrons from the emitter, the control function of this embodiment is exactly the same as that in the embodiment shown in FIG. 2.

Figure 4:
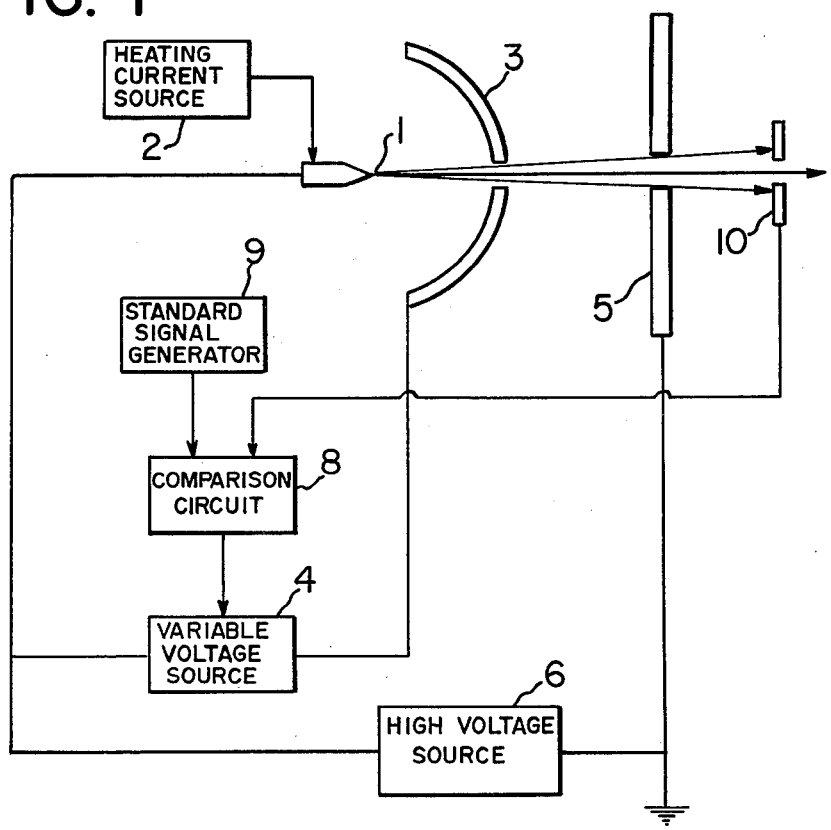

FIG. 4 shows a third embodiment of this invention in which an electron beam detector 10 arranged behind the second anode 5 is used instead of the emission current detector 7 described in the previous embodiments. In this case, the detector 10 comprised of a semi-conductor, for example, a simple electric conducting plate or a converter for converting the electron beam into a light or X-ray, said light or X-ray then being converted into an electrical signal.

Figure 5:
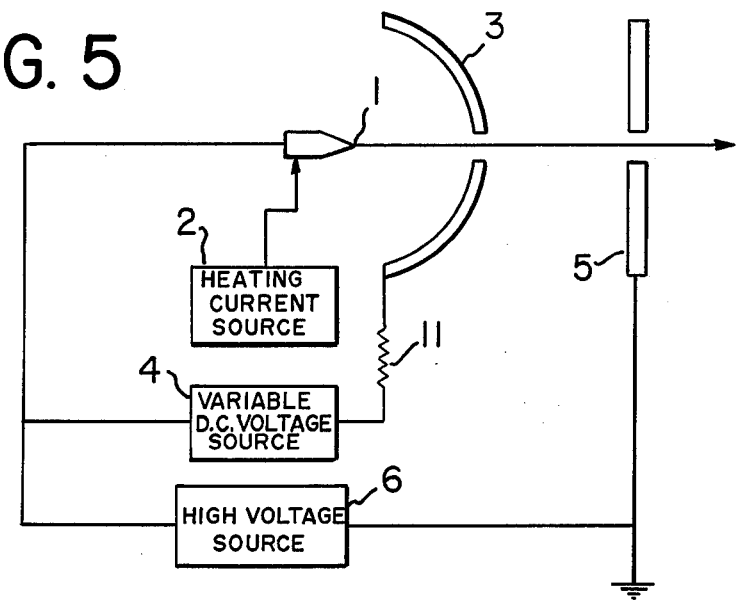

FIG. 5 shows a fourth embodiment of this invention in which a resistor 11 is connected between the variable D.C. voltage source 4 and the first anode 3 so as to control the electric field automatically. The resistor 11 has two functions, one being to detect the electron beam fluctuation and the other to control the electric field in accordance with said fluctuation. In this embodiment, the potential difference between the emitter 1 and the first anode 3 is equal to the sum of the output voltage $V_E$ of source 4 and the voltage across the resistor 11, the polarity of which is the opposite to that of the output voltage $V_E$ (volt). The reason for this is that the voltage across the resistor 11 (R ohm) is determined by the electron current Ie (ampere) flowing into the anode 3. Accordingly, voltage $V_{EA} = V_E - Ie \cdot R$ is applied between the emitter 1 and the anode 3. In this case, if Ie increases, $V_{EA}$ decreases so as to reduce the electron current by weakening the electric field. Conversely, if Ie decreases, $V_{EA}$ increases so as to increase the electron current by strengthening the electric field. Thus, by utilizing this embodiment, the stability of the electron beam current is improved. As a result, electron beam fluctuation due to the elapse of time or emitter exchange does not occur.

If a variable resistor is used instead of the fixed resistor 11, a simple constant voltage source can be used instead of the variable voltage source 4, because it would then be possible to vary voltage $V_{EA}$ by varying the variable resistor instead of varying the output of the voltage source 4.

Figure 6:
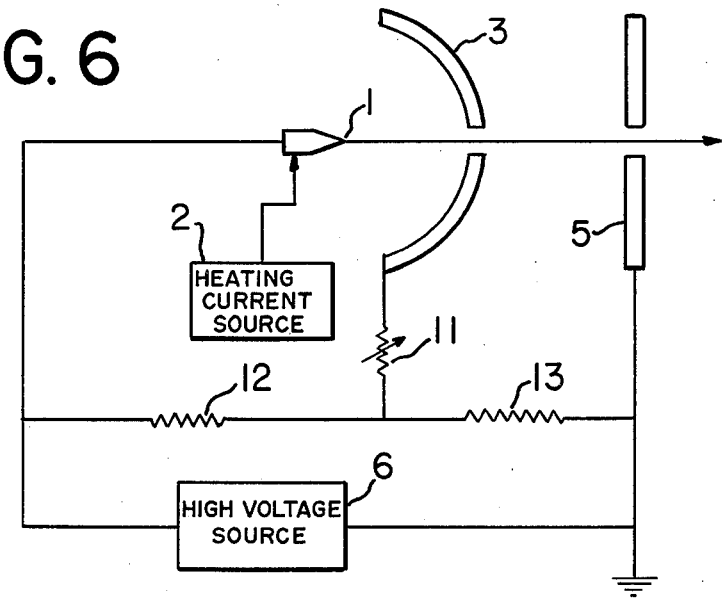

FIG. 6 shows a fifth embodiment of this invention in which voltage $V_{EA}$ is obtained by dividing resistors 12 and 13 instead of voltage source 4. In this case, resistor 11 can be omitted without affecting the circuit functionally.

Figure 7:
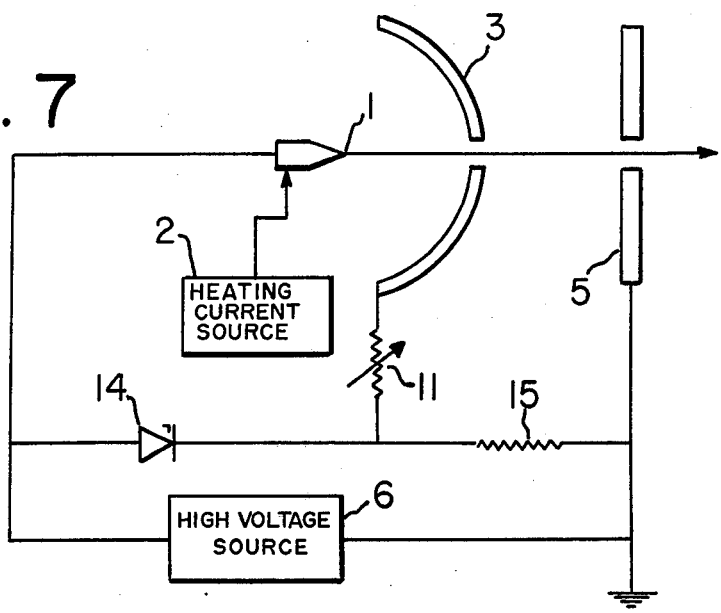

FIG. 7 shows a sixth embodiment of this invention in which a constant voltage element 14, comprising for example, Zener diodes, and a resistor 15 are used instead of resistors 12 and 13.

Figure 8:
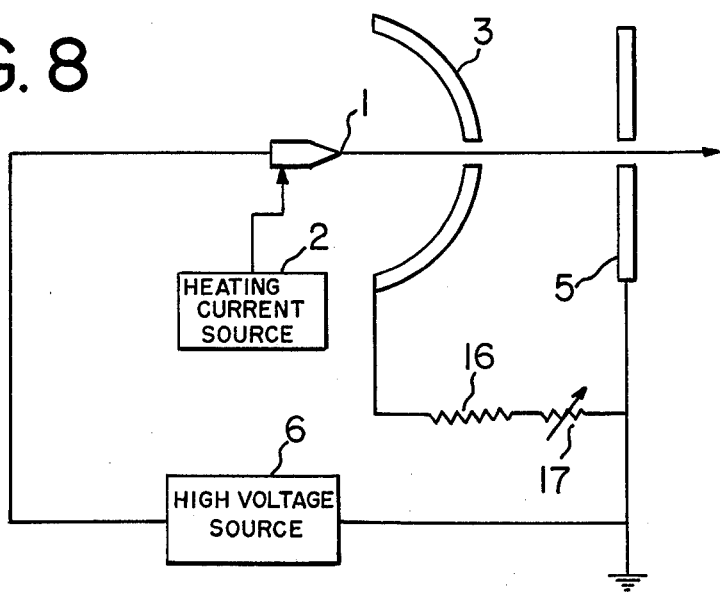

FIG. 8 shows a seventh embodiment of this invention in which the voltage $V_{EA}$ is obtained by a fixed resistor 16 and a variable resistor 17 through which the electron current flows from the first anode 3 to second anode 5.

Additionally, this invention is not limited to the above-mentioned embodiments. For example, this invention can be applied to the so called "cold emission type field emission gun" which corresponds to the embodiments where the heating means 2 is omitted in FIGS. 2 to 8, in order to prevent the emission current fluctuation due to the contamination on the emitter surface.

Having thus described the invention with the detail and particularity as required by the Patent Laws, what is desired protected by Letters Patent is set forth in the following claims.

1. A field emission type electron gun comprising:
an emitter for emitting an electron beam,
a first anode for generating a strong electric field at said emitter,
a first voltage source for generating a potential difference between said first anode and said emitter,
a second anode located behind the first anode maintained at ground potential,
a second high voltage source for supplying negative high potential to said emitter for accelerating said electron beam, a detecting means for detecting the electron beam emitted from said emitter and providing an output signal indicative of the electron beam fluctuation,
a comparing means for comparing the output signal of said detecting means with a reference signal and providing an output signal indicative of the comparison, and
a current control means that varies the current by varying the output voltage of the first voltage source and therefore the potential of the first anode in response to the output signal of the comparing means such that the electron current remains substantially constant.

2. A field emission type electron gun according to claim 1 in which said detecting means comprises a current detecting circuit located between said emitter and said second high voltage source.

3. A field emission type electron gun according to claim 1 in which said detecting means comprises a current detecting circuit located between said first anode and said first voltage source.

4. A field emission type electron gun according to claim 1 in which said detecting means comprises an electron beam detector located in the path of the electron beam passed through said second anode.

* * * * *